United States Patent
Lee et al.

(10) Patent No.: US 7,015,097 B2
(45) Date of Patent: Mar. 21, 2006

(54) METHOD OF MANUFACTURING FLASH MEMORY DEVICE

(75) Inventors: Seung Cheol Lee, Icheon-Shi (KR); Sang Wook Park, Seoul (KR); Pil Geun Song, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/887,260

(22) Filed: Jul. 8, 2004

(65) Prior Publication Data

US 2005/0277251 A1    Dec. 15, 2005

(30) Foreign Application Priority Data

Jun. 14, 2004    (KR) ...................... 10-2004-0043618

(51) Int. Cl.
   *H01L 21/336*    (2006.01)
(52) U.S. Cl. ....................... 438/257; 438/592
(58) Field of Classification Search ............... 438/257, 438/265, 303, 585, 592, 595
   See application file for complete search history.

(56) References Cited

U.S. PATENT DOCUMENTS

| 6,465,335 | B1 * | 10/2002 | Kunikiyo ..................... 438/592 |
| 6,605,521 | B1 * | 8/2003 | Ajmera et al. .............. 438/595 |
| 2003/0003656 | A1 * | 1/2003 | Dong et al. ................. 438/257 |
| 2004/0038487 | A1 * | 2/2004 | Olsen ......................... 438/287 |
| 2004/0259336 | A1 * | 12/2004 | Yeh et al. .................... 438/585 |

* cited by examiner

*Primary Examiner*—Phuc T. Dang
(74) *Attorney, Agent, or Firm*—Marshall, Gerstein & Borun LLP

(57) ABSTRACT

Provided relates to a method of a flash memory device, which performs a first rapid thermal oxidation process at a $H_2$ rich atmosphere for recovering an etched damage during a gate forming process, and performs a second rapid thermal oxidation process at the $H_2$ rich atmosphere for ion-activating after performing an ion implantation process for forming a cell transistor junction and a peripheral circuit transistor junction. As a result of those processes, a Si-dangling bond cut off during a gate etching process has a Si—H combination structure and the whole processing time is reduced, and thus an abnormal oxidation caused at an edge of an ONO layer and a tunnel oxide film, which can make it possible to prevent a smiling phenomena of the ONO layer and a bird's beak phenomena of the tunnel oxide film.

15 Claims, 6 Drawing Sheets

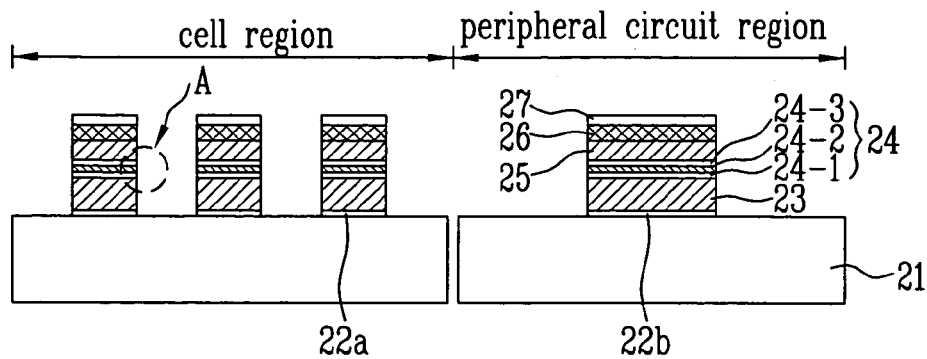
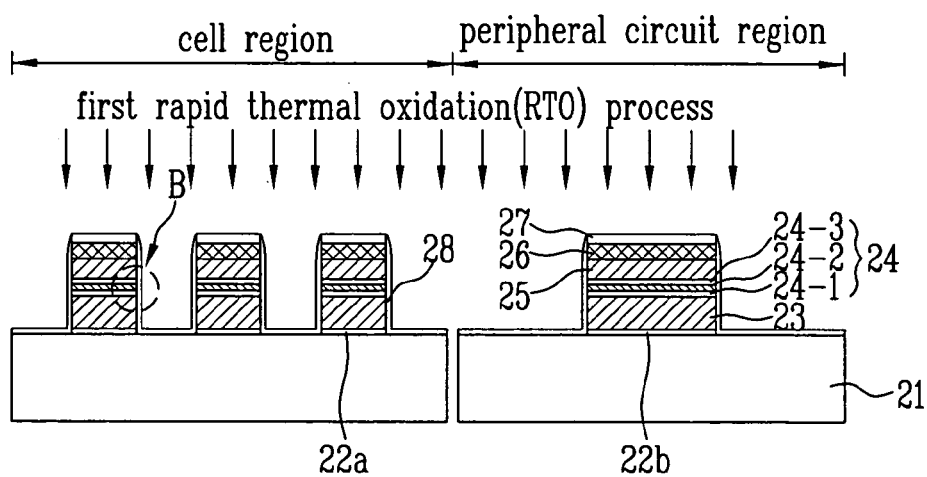
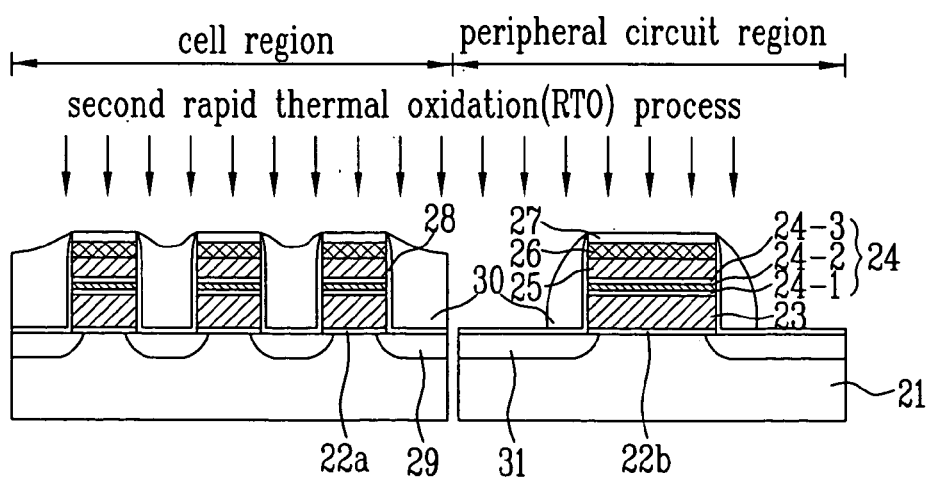

| processing order | loading | re-covering | ramping -up | stabi-lizing | thermal oxidation | N₂-purging | ramping -down | un-loading |
|---|---|---|---|---|---|---|---|---|
| time(min) | 15 | 10 | 20~90 | 5~10 | 0.1~10 | 20 | 20~90 | 30 |
| pressure (Torr) | 50 | 50 | 50 | 50 | 30~120 | 500 | 500 | 50 |
| N₂ (slpm) | 5~10 | 5~10 | 5~10 | 0 | 5~10 | 0~100 | 10 | 5~10 |
| O₂ (slpm) | 0 | 0 | 0.1~10 | 0.1~10 | 0.1~10 | 0 | 0 | 0 |
| H₂ (slpm) | 0 | 0 | 0 | 0 | 0.1~10 | 0 | 0 | 0 |

| processing order | loading | re-covering | ramping -up | stabi-lizing | H₂-annealing | thermal oxidation | N₂-purging | ramping -down | un-loading |
|---|---|---|---|---|---|---|---|---|---|
| time(min) | 15 | 10 | 20~90 | 5~10 | 0.1~2 | 0.1~10 | 20 | 20~90 | 30 |
| pressure (Torr) | 50 | 50 | 50 | 50 | 30~120 | 30~120 | 500 | 500 | 50 |
| N₂ (slpm) | 5~10 | 5~10 | 5~10 | 0 | 0 | 5~10 | 0~100 | 10 | 5~10 |
| O₂ (slpm) | 0 | 0 | 0.1~10 | 0.1~10 | 0 | 0.1~10 | 0 | 0 | 0 |
| H₂ (slpm) | 0 | 0 | 0 | 0 | 0.1~10 | 0.1~10 | 0 | 0 | 0 |

FIG.8

| processing order | loading | re-covering | ramping -up | stabi-lizing | thermal oxidation | H₂-annealing | N₂ -purging | ramping -down | un-loading |
|---|---|---|---|---|---|---|---|---|---|
| time(min) | 15 | 10 | 20~90 | 5~10 | 0.1~10 | 0.1~2 | 20 | 20~90 | 30 |
| pressure (Torr) | 50 | 50 | 50 | 50 | 30~120 | 30~120 | 500 | 500 | 50 |
| N₂ (slpm) | 5~10 | 5~10 | 5~10 | 0 | 5~10 | 0 | 0~100 | 10 | 5~10 |
| O₂ (slpm) | 0 | 0 | 0.1~10 | 0.1~10 | 0.1~10 | 0 | 0 | 0 | 0 |
| H₂ (slpm) | 0 | 0 | 0 | 0 | 0.1~10 | 0.1~10 | 0 | 0 | 0 |

850 °C~1050 °C (peak); 400 °C (start and end)

METHOD OF MANUFACTURING FLASH MEMORY DEVICE

BACKGROUND

1. Field of the Invention

The present invention relates to a method of manufacturing a flash memory device, and more particularly to, a method of manufacturing a flash memory device which can prevent a smiling phenomena of an ONO layer and a bird's beak phenomena of a tunnel oxide film.

2. Discussion of Related Art

In general, a flash memory device forms gates in a cell region and a peripheral circuit region and then performs a re-oxidation process for recovering an etched damage. After performing an ion implantation process for forming a cell transistor junction and a peripheral transistor junction, the flash memory device performs a source/drain annealing process for ion-activating. The re-oxidation process recovers an edge of a tunnel oxide film and a surface of a semiconductor substrate which have damaged due to a etching process for forming a gate. Here, the re-oxidation process is performed to improve a retention characteristic, one of intrinsic characteristics. Furthermore, an oxide film formed by the re-oxidation process acts as a barrier for relieving the damage on the semiconductor substrate up to a certain point during performing the source/drain ion implantation process as a succeeding process.

FIG. 1 is a cross-sectional diagram illustrating a unit cell transistor formed by a method of manufacturing a flash memory device of the conventional art.

Referring to FIG. 1, a gate of a cell transistor is formed on a cell region of a semiconductor substrate 11 by stacking a tunnel oxide film 12a, a first polysilicon layer 13, a lower oxide film 14-1, an intermediate nitride film 14-2, an upper oxide film 14-3, a second polysilicon layer 15, a tungsten silicide layer 16, and a cap insulation film 17, according to a gate forming process. Although it is not shown, gates of a high voltage transistor and a low voltage transistor are formed in the peripheral circuit region. In the cell region, the first polysilicon layer 13 acts as a floating gate, an ONO layer 14 comprised by stacking the lower oxide film 14-1, the intermediate nitride film 14-2, and the upper oxide film 14-3 acts as a dielectric film. The second polysilicon layer 15 and the tungsten silicide layer 16 act as a control gate, and the cap insulation film 17 acts to prevent the tungsten silicide layer 16 from being oxidated during the succeeding thermal process by being formed with an oxide pattern or a nitride pattern.

During the gate forming process, the re-oxidation process is performed to recover the part damaged by the etching process. In response to this, a sidewall oxide film 18 is formed on the gate sidewall and the semiconductor substrate 11. The cell transistor junction 19 is formed by light doped drain LDD ion implantation process. Although it isn't shown, a LDD region of a low voltage transistor is formed in the peripheral circuit region. After then, a source/drain junction of the peripheral circuit transistor is formed by performing the source/drain ion implantation process, and a source/drain annealing process is performed for ion-activating all the source/drain junction formed in the cell region and the peripheral circuit region.

In the aforementioned method of manufacturing the conventional flash memory device, the re-oxidation process and the source/drain annealing process have been performed by a furnace thermal oxidation method. According to this, the re-oxidation process takes approximately 6 hours and the source/drain annealing process takes approximately 4 hours. The processes performed in twice which take a long time cause a bird's beak at the edge part "A" of the tunnel oxide film 12a, and a smiling phenomena at the edge part "B" of the ONO layer 14.

Especially, the re-oxidation process is performed in the condition of having a plasma damage which Si-dangling bond is cut off from an etched surface of the first and second polysilicon layers 13, 15 by a gate etching process. As a result of this, the Si-dangling bond easily reacts upon oxygen and thus a sidewall oxidation of the first and second polysilicon layers 13, 15 is rapidly progressed. During this, the sidewall oxidation of the first and second polysilicon layers 13, 15 is more rapidly progressed near the ONO layer 14 and the tunnel oxide film 12a, which causes the bird's beak and the smiling phenomena thereby. Furthermore, the sidewall part "C" of the tungsten silicide layer 16 is oxidated. Accordingly, the last gate profile has a negative type after completing the re-oxidation process.

The bird's beak on the tunnel oxide film and the smiling on the ONO layer cause a charge leakage and decrease of coupling ratio important in the flash memory. As a result of those, the device becomes worse in the manner of an electric characteristic. Moreover, the oxidation of the tungsten silicide layer 16 increases a surface resistance of the control gate. Therefore, the flash memory device manufactured by the conventional method degrades a charge retention characteristic and reliability characteristic as well as programming and erasing characteristics. Furthermore, in the conventional method, it takes a long time to perform the re-oxidation process and the source/drain annealing process, which results to drop down productivity.

SUMMARY OF THE INVENTION

The present invention is directed to provide a method of manufacturing a flash memory device capable of preventing a smiling phenomena on an ONO layer and a bird's beak phenomena on a tunnel oxide film, controlling increase of a surface resistance of a control gate, and improving productivity by means of shortening the whole processing time.

One aspect of the present invention is to a method of manufacturing a flash memory device which comprises the steps of: forming gates on a semiconductor substrate in a cell region and a peripheral circuit region by means of a gate forming process; performing a first rapid thermal oxidation process for recovering an etched damage during the gate forming process and forming a sidewall oxide film thereby; forming a cell transistor junction in the cell region; forming a peripheral circuit transistor junction in the peripheral circuit region; and performing a second rapid thermal oxidation process for activating ion implanted in the junctions.

Here, the gates in the cell region is constructed by stacking a tunnel oxide film, a first polysilicon layer, a lower oxide film, an intermediate nitride film, an upper oxide film, a second polysilicon layer, a tungsten silicide layer, and a cap insulation film.

The sidewall oxide film is formed with thickness of 30 to 80 Å.

The first and second rapid thermal oxidation processes respectively include the steps of: loading a wafer to a chamber of 400° C.; recovering the internal of the chamber; ramping-up the internal temperature of the chamber up to 850 to 1050° C.; stabilizing the internal temperature of the chamber; performing a thermal oxidation process at an $H_2$ rich atmosphere; $N_2$-purging the internal of the chamber;

ramping-down the internal temperature of the chamber down to 400° C.; and unloading the wafer from the chamber.

The loading step is performed by setting an internal pressure of the chamber for 50 Torr and an inflow of $N_2$ gas between 5 and 10 slpm. The recovering step is performed by setting the internal pressure of the chamber for 50 Torr and the inflow of $N_2$ gas between 5 and 10 slpm. The ramping-up step is performed for 20 to 90 minutes by setting the internal pressure of the chamber for 50 Torr, the inflow of $N_2$ gas between 5 and 10 slpm, and an inflow of $O_2$ gas between 0.1 and 10 slpm. The stabilizing step is performed by setting the internal pressure of the chamber for 50 Torr and the inflow of $O_2$ gas between 0.1 and 10 slpm. The thermal oxidation step is performed for 0.1 to 10 minutes by setting the internal pressure of the chamber between 30 to 120 Torr, the inflow of $N_2$ gas between 5 and 10 slpm, and the inflow of $O_2$ gas between 0.1 and 10 slpm, and the inflow of $H_2$ gas between 0.1 and 10 slpm. The $N_2$-purging step is performed by setting the internal pressure of the chamber for 500 Torr and the inflow of $N_2$ gas between 0 and 100 slpm. The ramping-down step is performed for 20 to 90 minutes by setting the internal pressure of the chamber for 500 Torr and the inflow of $N_2$ gas for 10 slpm. The unloading step is performing by setting the internal pressure of the chamber for 50 Torr and an inflow of $N_2$ gas between 5 and 10 slpm.

The first rapid thermal oxidation process additionally has a $H_2$-annealing step between the stabilizing step and the thermal oxidation step or between the thermal oxidation step and the $N_2$-purging step. The $H_2$-annealing step is performed for 0.1 to 2 minutes by setting the internal pressure of the chamber between 30 and 120 Torr and the inflow of $H_2$ gas between 0.1 and 10 slpm.

BRIEF DESCRIPTION OF THE DRAWINGS

FIGS. 2A to 2C are cross-sectional diagrams of a device illustrating a method of manufacturing a flash memory device in accordance with embodiments of the present invention.

FIGS. 6, 7, and 8 are recipes of respectively different rapid thermal oxidation processes applicable to embodiments of the present invention.

DETAILED DESCRIPTION OF PREFERRED EMBODIMENTS

Figure 1:
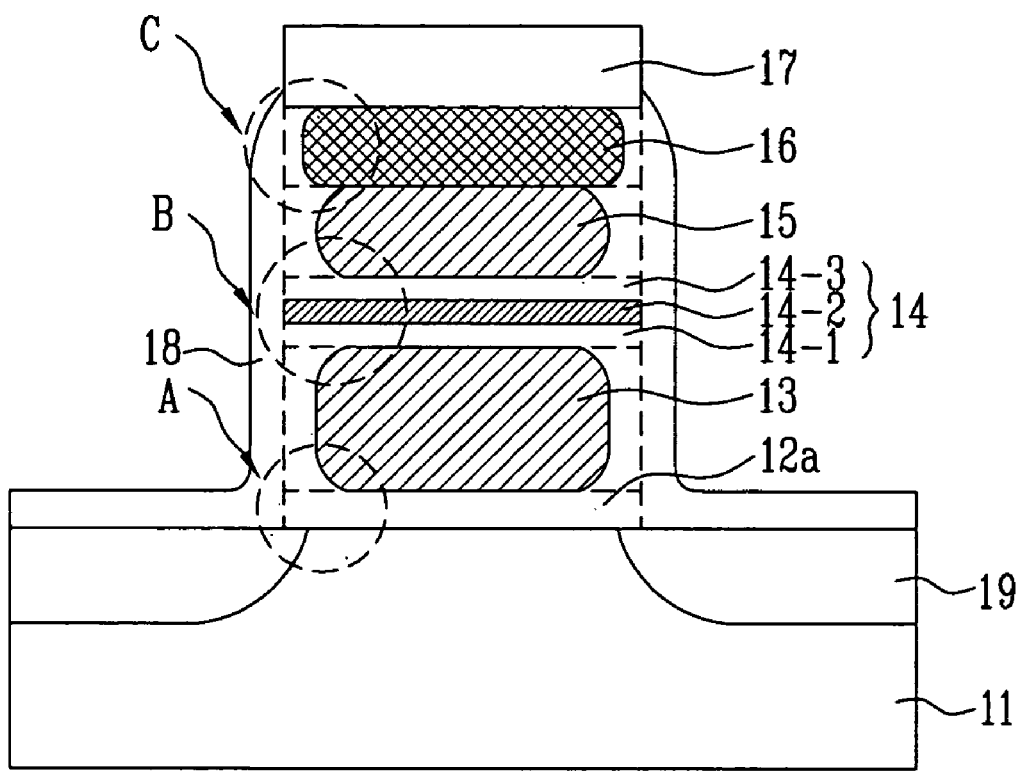
FIG. 1 is a cross-sectional diagram illustrating a unit cell transistor formed by a method of manufacturing a flash memory device of the conventional art.

Hereinafter, a method of manufacturing a flash memory device will be described in accordance with preferred embodiments of the present invention with reference to the accompanying drawings.

FIGS. 2A to 2C are cross-sectional diagrams of a device illustrating a method of manufacturing a flash memory device in accordance with embodiments of the present invention.

Referring to FIG. 2A, a gate of a cell transistor is formed on a cell region of a semiconductor substrate 21 by stacking a tunnel oxide film 22a, a first polysilicon layer 23, a lower oxide film 24-1, an intermediate nitride film 24-2, an upper oxide film 24-3, a second poly-silicon layer 25, a tungsten silicide layer 26, and a cap insulation film 27, according to a gate forming process. During this, gates of a high voltage transistor and a low voltage transistor are formed on the semiconductor substrate 21 in a peripheral circuit region with the same structure to the gate of the cell transistor except the thickness of a gate oxide film 22b corresponding to the tunnel oxide film 22a in the cell region. In the cell region, the first polysilicon layer 23 acts as a floating gate, an ONO layer 24 formed by stacking the lower oxide film 24-1, the intermediate nitride film 24-2, and the upper oxide film 24-3 acts as a dielectric film. The second polysilicon layer 25 and the tungsten silicide layer 26 act as a control gate, and the cap insulation film 27 acts to prevent the tungsten silicide layer 26 from being oxidated during the succeeding thermal process.

In the aforementioned, the ONO layer 24 is comprised by stacking the lower oxide film 24-1, the intermediate nitride film 24-2, and the upper oxide film 24-3. The lower oxide film 24-1 and the upper oxide film 24-3 are formed by depositing a hot temperature oxide HTO using DCS ($SiH_2Cl_2$) and $N_2O$ gas as a source. The intermediate oxide film 24-2 is formed by LPCVD method at the atmosphere in the temperature 650 to 800° C. under a low pressure below 1 to 3 Torr by using $NH_3$+DCS, as a reactive vapor. The cap insulation film 27 is formed with an oxide pattern or a nitride pattern.

Figure 3:
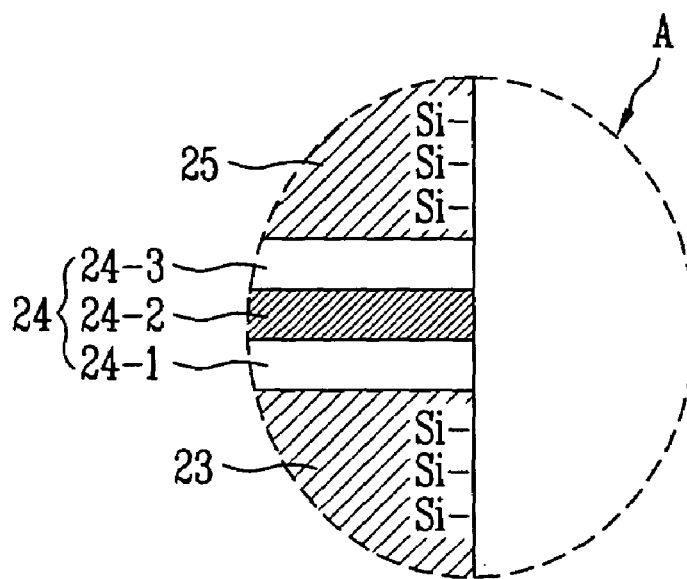
FIG. 3 is an enlarged cross-sectional diagram illustrating a state after completing a gate etching process at a gate sidewall "A" of a cell transistor shown in FIG. 2A.

FIG. 3 is an enlarged cross-sectional diagram illustrating a state after completing a gate etching process at a gate sidewall "A" of a cell transistor shown in FIG. 2A. As shown in FIG. 3, a plasma damage which a Si-dangling bond is cut off is caused on the etched surface of the first and second polysilicon layers 23, 25 during the gate etching process. In this case, the re-oxidation process by a thermal oxidation method is performed in the conventional technique. During this, however, the dangling bond which has been cut off reacts upon oxygen and thus is easily changed to an oxide film. Especially, the conventional technique degrades reliability of a device by reducing speed of program by irregularly transferring a voltage applied to a gate due to causing bird's beak and smiling phenomena caused by an abnormal oxidation reaction on a surface limit between the lower oxide film 24-1 and the first polysilicon layer 23 or between the upper oxide film 24-3 and the second polysilicon layer 25.

Referring to FIG. 2B, in order to recover a plasma damage cutting off the Si-dangling bond from the etched surface of the first and second polysilicon layers 23, 25, a first rapid thermal oxidation RTO process is performed. In response to this, a sidewall oxide film 28 is formed on the gate sidewall and the semiconductor substrate 11. The sidewall oxide film 28 is formed with a thickness of 30 to 80 Å by a process recipe which will be described as follows.

The first rapid thermal oxidation process is progressed by three kinds of process recipes.

The first process recipe, as shown in FIG. 6, includes the steps of: loading a wafer which the gate is formed on to a chamber of 400° C.; recovering the internal of the chamber; ramping-up the internal temperature of the chamber up to 850 to 1050° C.; stabilizing the internal temperature of the chamber; performing a thermal oxidation at the $H_2$ rich atmosphere and thereby forming a sidewall oxide film 28 on the gate sidewall and the semiconductor substrate; $N_2$-purging the internal of the chamber; ramping-down the internal temperature of the chamber down to 400° C.; and unloading the wafer on which the sidewall oxide film 28 is formed from the chamber.

The loading step is performed for 15 minutes by setting the internal pressure of the chamber for 50 Torr and the inflow of $N_2$ gas between 5 and 10 slpm.

The recovering step is performed for 10 minutes by setting the internal pressure of the chamber for 50 Torr and the inflow of $N_2$ gas between 5 and 10 slpm.

The ramping-up step is performed for 20 to 90 minutes by setting the internal pressure of the chamber for 50 Torr, the inflow of $N_2$ gas between 5 and 10 slpm, and the inflow of $O_2$ gas between 0.1 to 10 slpm.

The stabilizing step is performed for 5 to 10 minutes by setting the internal pressure of the chamber for 50 Torr and the inflow of $O_2$ gas between 0.1 to 10 slpm.

The thermal oxidation step is performed for 0.1 to 10 minutes by setting the internal pressure of the chamber between 30 to 120 Torr, the inflow of $N_2$ gas between 5 and 10 slpm, the inflow of $O_2$ gas between 0.1 to 10 slpm, and the inflow of $H_2$ gas between 0.1 to 10 slpm The $N_2$-purging step is performed for 20 minutes by setting the internal pressure of the chamber for 500 Torr and the inflow of $N_2$ gas between 0 and 100 slpm.

The ramping-down step is performed for 20 to 90 minutes by setting the internal pressure of the chamber for 500 Torr and the inflow of $N_2$ gas for 10 slpm.

The unloading step is performed for 30 minutes by setting the internal pressure of the chamber for 50 Torr and the inflow of $N_2$ gas between 5 and 10 slpm.

Figure 4:
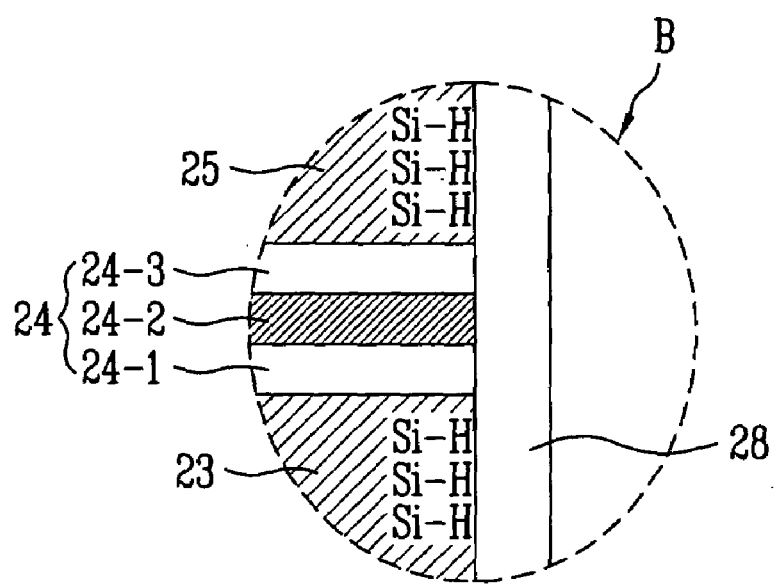
FIG. 4 is an enlarged cross-sectional diagram illustrating a state after completing a rapid thermal oxidation process at a gate sidewall "B" of a cell transistor shown in FIG. 2B.

FIG. 4 is an enlarged cross-sectional diagram illustrating a state after completing a rapid thermal oxidation process at a gate sidewall "B" of a cell transistor shown in FIG. 2*b*. As shown in FIG. 4, the $H_2$ gas in the thermal oxidation step has a Si—H combination structure by reacting upon an incomplete Si existing on the etched surface of the first and second polysilicon layers 23, 25. The Si—H combination structure acts to control an abnormal oxidation. As a result of this, the bird's beak or smiling phenomena is not caused.

The second process recipe, as shown in FIG. 7, has the same structure to the first process recipe except having an additional $H_2$-annealing step between the stabilizing step and the thermal oxidation step, comparing with the first process recipe. According to this, it will be described only about the $H_2$-annealing step but not be described about the rest of steps.

The $H_2$-annealing step is performed for 0.1 to 2 minutes by setting the internal pressure of the chamber between 30 to 120 Torr and the inflow of $H_2$ gas between 0.1 to 10 slpm. During performing the $H_2$-annealing step, the $H_2$ gas has a Si—H combination structure by reacting upon an incomplete Si existing on the etched surface of the first and second polysilicon layers 23, 25 and then the thermal oxidation step at the $H_2$ rich atmosphere is performed. As a result of this, the sidewall oxide film 28 can be formed without an abnormal oxidation.

As shown in FIG. 8, the third process recipe has the same structure to the first process recipe except having an additional $H_2$-annealing step between the thermal oxidation step and the $N_2$-purging step, comparing with the first process recipe. Furthermore, the third process recipe only has a different process order comparing with the second recipe and the $H_2$-annealing step has the same condition to the second process recipe. According to this, it will not described about the conditions for each step of the third process recipe.

In the third process recipe, during performing the thermal oxidation step, the $H_2$ gas reacts upon the incomplete Si existing the etched surface of the first and second polysilicon layers 23, 25 and thus has the Si—H combination structure. The $H_2$-annealing step is performed in the Si—H combination structure and thereby the Si—H combination structure is remarkably completed.

Referring to FIG. 2C, after performing the process forming the sidewall oxide film 28, there are other processes to be performed such as a double doped drain DDD ion implantation process of a high voltage transistor in the peripheral circuit region, a light doped drain LDD ion implantation process of a low voltage transistor in the peripheral circuit region, a spacer insulation film depositing and a spacer etching processes, and a source/drain ion implantation process of the low voltage transistor in the peripheral circuit region. In response to those processes, a cell transistor junction 29, a spacer insulation film 30, and a peripheral circuit transistor junction 31 are formed. The cell transistor junction 29 is formed during the LDD ion implantation process of the low voltage transistor.

After this, a second rapid thermal oxidation RTO process is performed, and, in response to this, the ion implanted to all the junctions 29, 31 are activated.

The second rapid thermal oxidation process includes the steps of: loading the wafer on which the junctions are formed to the chamber of 400° C.; recovering the internal of the chamber; ramping-up the internal temperature of the chamber between 850 and 1050° C.; stabilizing the internal temperature of the chamber; performing the thermal oxidation at the $H_2$ rich atmosphere, and thereby activating the ion implanted to the junctions; $N_2$-purging the internal of the chamber; ramping-down the internal temperature of the chamber to 400° C.; and unloading the wafer from the chamber.

The loading step is performed for 15 minutes by setting the internal pressure of the chamber for 50 Torr and the inflow of $N_2$ gas between 5 and 10 slpm.

The recovering step is performed for 10 minutes by setting the internal pressure of the chamber for 50 Torr and the inflow of $N_2$ gas between 5 and 10 slpm.

The ramping-up step is performed for 20 to 90 minutes by setting the internal pressure of the chamber for 50 Torr, the inflow of $N_2$ gas between 5 and 10 slpm, and the inflow of $O_2$ gas between 0.1 to 10 slpm.

The stabilizing step is performed for 5 to 10 minutes by setting the internal pressure of the chamber for 50 Torr and the inflow of $O_2$ gas between 0.1 to 10 slpm.

The thermal oxidation step is performed for 0.1 to 10 minutes by setting the internal pressure of the chamber between 30 to 120 Torr, the inflow of $N_2$ gas between 5 and 10 slpm, the inflow of $O_2$ gas between 0.1 to 10 slpm, and the inflow of $H_2$ gas between 0.1 to 10 slpm The $N_2$-purging step is performed for 20 minutes by setting the internal pressure of the chamber for 500 Torr and the inflow of $N_2$ gas between 0 and 100 slpm.

The ramping-down step is performed for 20 to 90 minutes by setting the internal pressure of the chamber for 500 Torr and the inflow of $N_2$ gas for 10 slpm.

The unloading step is performed for 30 minutes by setting the internal pressure of the chamber for 50 Torr and the inflow of $N_2$ gas between 5 and 10 slpm.

On the other hand, the second rapid thermal oxidation process can be performed by the process recipes shown in FIGS. 7 and 8, respectively.

Figure 5:
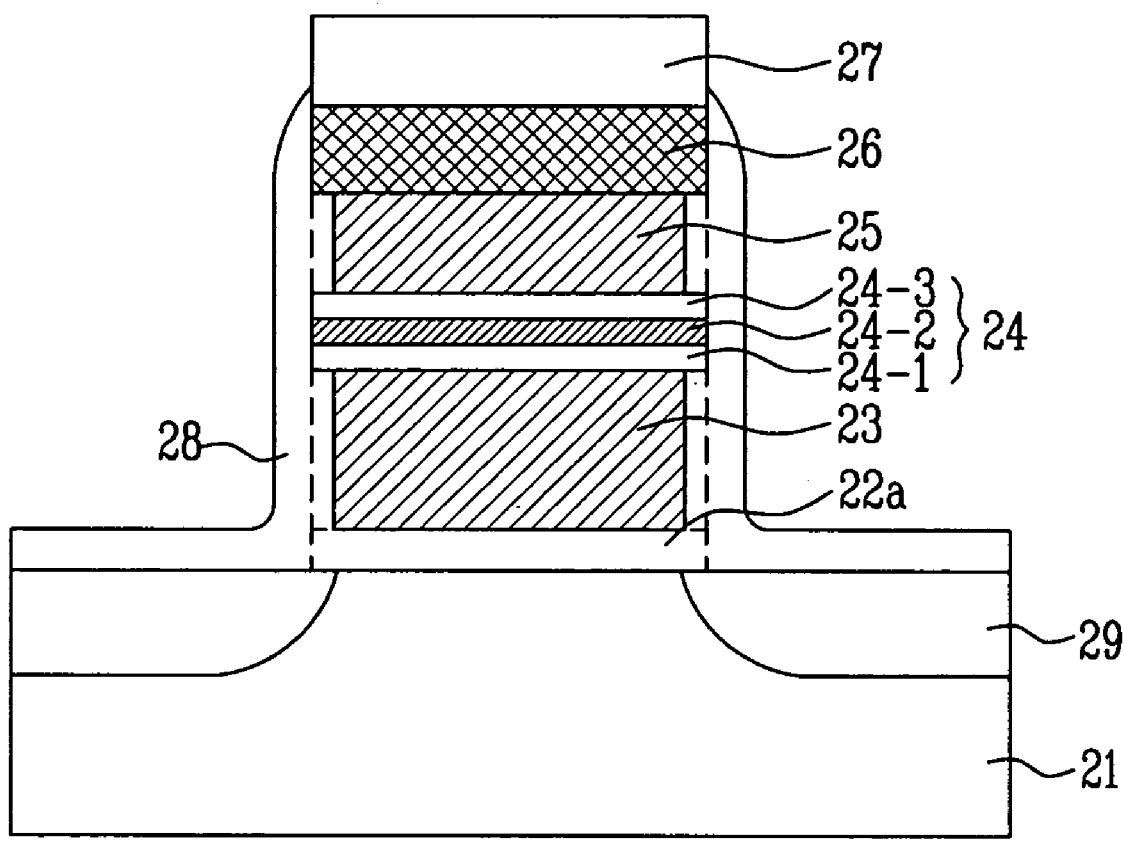
FIG. 5 is a cross-sectional diagram illustrating an unit cell transistor formed by an embodiment of the present invention.

FIG. 5 is a cross-sectional diagram illustrating an unit cell transistor formed by an embodiment of the present invention. It shows that the smiling phenomena is not caused on the ONO layer 24, the bird's beak phenomena is not caused on the tunnel oxide film 22a, and the tungsten silicide layer 26 is not oxidized. Because the plasma etched damage gotten during activating the ion implanted to the junctions is recovered by the rapid thermal oxidation process at the $H_2$ rich atmosphere and the implanted ion to the junctions is activated, and thus the abnormal oxide reaction is not caused, there are no smiling and bird's beak phenomena and the tungsten silicide layer 26, referring to thermodynamics, is not oxidized because the oxidation process isn't performed at the $H_2$ rich atmosphere.

As described earlier, the present invention recovers the etched damage during the gate forming process, and performs the rapid thermal oxidation process at the $H_2$ rich atmosphere for ion activation after performing the ion implantation process for forming the cell transistor junction and the source/drain junction of the peripheral circuit transistor. As a result, the Si-dangling bond cut off during the gate etching process has the Si—H combination structure and the whole processing time is reduced, which results to control the abnormal oxidation occurred at the edge of the ONO layer and the tunnel oxide film. The present invention thus prevents the bird's beak phenomena in the tunnel oxide film. Furthermore, the present invention can control increase of the surface resistance in the control gate by preventing the oxidation of the tungsten silicide layer, and achieve improvement of productivity and cost reduction by reducing the whole processing time.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of manufacturing a flash memory device, comprising the steps of:
    forming gates on a semiconductor substrate in a cell region and a peripheral circuit region;
    performing a first rapid thermal oxidation process for recovering an etched damage during the gate forming process in an $H_2$ rich atmosphere so that an etched surface of a gate changes to a Si—H combination structure to prevent an abnormal oxidation from occurring and forming a sidewall oxide film thereby;
    forming a cell transistor junction in the cell region;
    forming a peripheral circuit transistor junction in the peripheral circuit region; and
    performing a second rapid thermal oxidation process for activating ion implanted in the junctions.

2. The method of manufacturing a flash memory device of claim 1, the gates in the cell region is constructed by stacking a tunnel oxide film, a first polysilicon layer, a lower oxide film, an intermediate nitride film, an upper oxide film, a second polysilicon layer, a tungsten silicide layer, and a cap insulation film.

3. The method of manufacturing a flash memory device of claim 1, the sidewall oxide film is formed with thickness of 30 to 80.

4. The method of manufacturing a flash memory device of claim 1, the first and second rapid thermal oxidation processes respectively comprise the steps of:
    loading a wafer to a chamber of 400° C.;
    recovering the internal of the chamber;
    ramping-up the internal temperature of the chamber up to 850 to 1050° C.;
    stabilizing the internal temperature of the chamber;
    performing a thermal oxidation process in the $H_2$ rich atmosphere;
    $N_2$-purging the internal of the chamber;
    ramping-down the internal temperature of the chamber down to 400° C.; and
    unloading the wafer from the chamber.

5. The method of manufacturing a flash memory device of claim 4, the loading step is performed by setting an internal pressure of the chamber for 50 Torr and an inflow of $N_2$ gas between 5 and 10 slpm.

6. The method of manufacturing a flash memory device of claim 4, the recovering step is performed by setting the internal pressure of the chamber for 50 Torr and the inflow of $N_2$ gas between 5 and 10 slpm.

7. The method of manufacturing a flash memory device of claim 4, the ramping-up step is performed for 20 to 90 minutes by setting the internal pressure of the chamber for 50 Torr, the inflow of $N_2$ gas between 5 and 10 slpm, and an inflow of $O_2$ gas between 0.1 and 10 slpm.

8. The method of manufacturing a flash memory device of claim 4, the stabilizing step is performed by setting the internal pressure of the chamber for 50 Torr and the inflow of $O_2$ gas between 0.1 and 10 slpm.

9. The method of manufacturing a flash memory device of claim 4, the thermal oxidation step is performed for 0.1 to 10 minutes by setting the internal pressure of the chamber between 30 to 120 Torr, the inflow of $N_2$ gas between 5 and 10 slpm, and the inflow of $O_2$ gas between 0.1 and 10 slpm, and the inflow of $H_2$ gas between 0.1 and 10 slpm.

10. The method of manufacturing a flash memory device of claim 4, the $N_2$-purging step is performed by setting the internal pressure of the chamber for 500 Torr and the inflow of $N_2$ gas between 0 and 100 slpm.

11. The method of manufacturing a flash memory device of claim 4, the ramping-down step is performed for 20 to 90 minutes by setting the internal pressure of the chamber for 500 Torr and the inflow of $N_2$ gas for 10 slpm.

12. The method of manufacturing a flash memory device of claim 4, the unloading step is performing by setting the internal pressure of the chamber for 50 Torr and an inflow of $N_2$ gas between 5 and 10 slpm.

13. The method of manufacturing a flash memory device of claim 4, the first rapid thermal oxidation process additionally has a $H_2$-annealing step between the stabilizing step and the thermal oxidation step.

14. The method of manufacturing a flash memory device of claim 4, the first rapid thermal oxidation process additionally has a $H_2$-annealing step between the thermal oxidation step and the $N_2$-purging step.

15. The method of manufacturing a flash memory device of claim 13, the $H_2$-annealing step is performed for 0.1 to 2 minutes by setting the internal pressure of the chamber between 30 and 120 Torr and the inflow of $H_2$ gas between 0.1 and 10 slpm.

* * * * *

UNITED STATES PATENT AND TRADEMARK OFFICE
CERTIFICATE OF CORRECTION

| | | |
|---|---|---|
| PATENT NO. | : 7,015,097 B2 | Page 1 of 1 |
| APPLICATION NO. | : 10/887260 | |
| DATED | : March 21, 2006 | |
| INVENTOR(S) | : Seung C. Lee et al. | |

It is certified that error appears in the above-identified patent and that said Letters Patent is hereby corrected as shown below:

At Column 8, line 46, "is performing by" should be -- is performed by --.

Signed and Sealed this

Sixth Day of February, 2007

JON W. DUDAS
*Director of the United States Patent and Trademark Office*